United States Patent [19]

Rickenbacker

[11] 4,298,969
[45] Nov. 3, 1981

[54] METHOD AND APPARATUS FOR TESTING THE IMPEDANCES OF GEOPHONE CHANNELS

[75] Inventor: James E. Rickenbacker, Houston, Tex.

[73] Assignee: Exxon Production Research Company, Houston, Tex.

[21] Appl. No.: 78,868

[22] Filed: Sep. 26, 1979

[51] Int. Cl.³ .................. G01V 1/16; G01V 1/00; G01C 27/00
[52] U.S. Cl. .................. 367/76; 367/13; 324/51; 324/57 R; 179/175.3 F; 73/1 DV
[58] Field of Search .................. 324/51, 57 R, 62; 179/175.3 F, 3 R; 367/13, 76; 73/1 DV

[56] References Cited

U.S. PATENT DOCUMENTS

| 2,946,951 | 7/1960 | Boode | 324/62 R |
|---|---|---|---|
| 3,277,364 | 10/1966 | Abrahamson | 324/54 |
| 3,370,232 | 2/1968 | Wickersham | 324/57 |
| 3,717,810 | 2/1973 | Spanbauer | 324/57 R |
| 3,858,169 | 12/1974 | Bardeen | 367/76 |
| 4,015,202 | 3/1977 | Fredriksson et al. | 324/57 Q |
| 4,039,806 | 8/1977 | Fredriksson et al. | 367/76 |
| 4,043,175 | 8/1977 | Fredriksson et al. | 73/1 DV |
| 4,151,459 | 4/1979 | Foyolle et al. | 324/52 |
| 4,184,143 | 1/1980 | Stafford | 367/13 |
| 4,224,483 | 9/1980 | Neigh et al. | 324/57 R |

FOREIGN PATENT DOCUMENTS 600494  1/1976  U.S.S.R. .................. 367/13

Primary Examiner—Nelson Moskowitz
Attorney, Agent, or Firm—George E. Glober

[57] ABSTRACT

This application relates to seismic data gathering devices and to testing the impedances of the geophone channels of such devices. The invention includes impressing a test current on each channel to be tested, said current developing a test voltage indicative of the impedance; generating a high reference voltage which corresponds to the maximum acceptable impedance of the channel; generating a low reference voltage which corresponds to the minimum acceptable impedance of the channel; and comparing the test voltage with the reference voltages.

6 Claims, 7 Drawing Figures

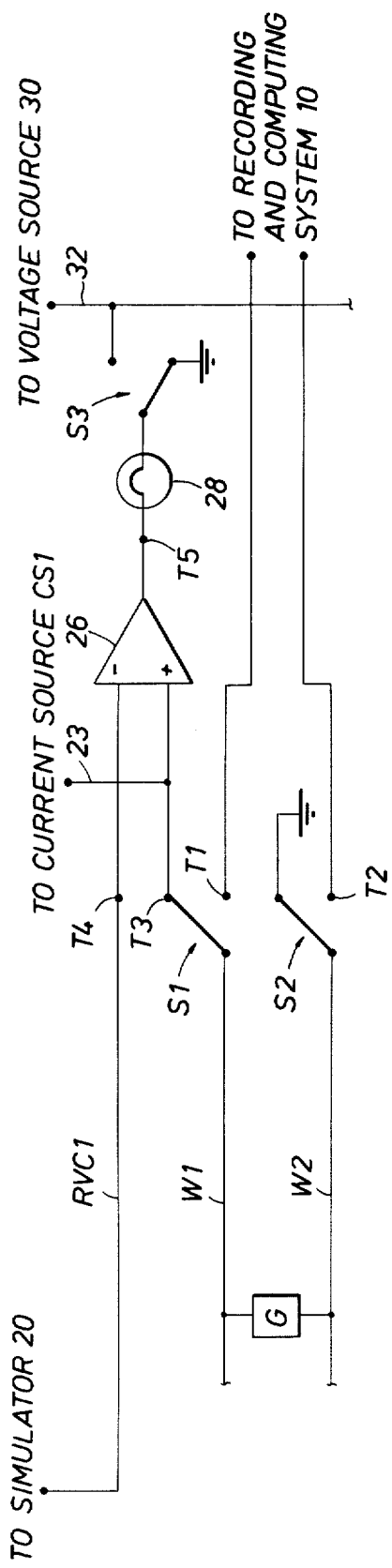
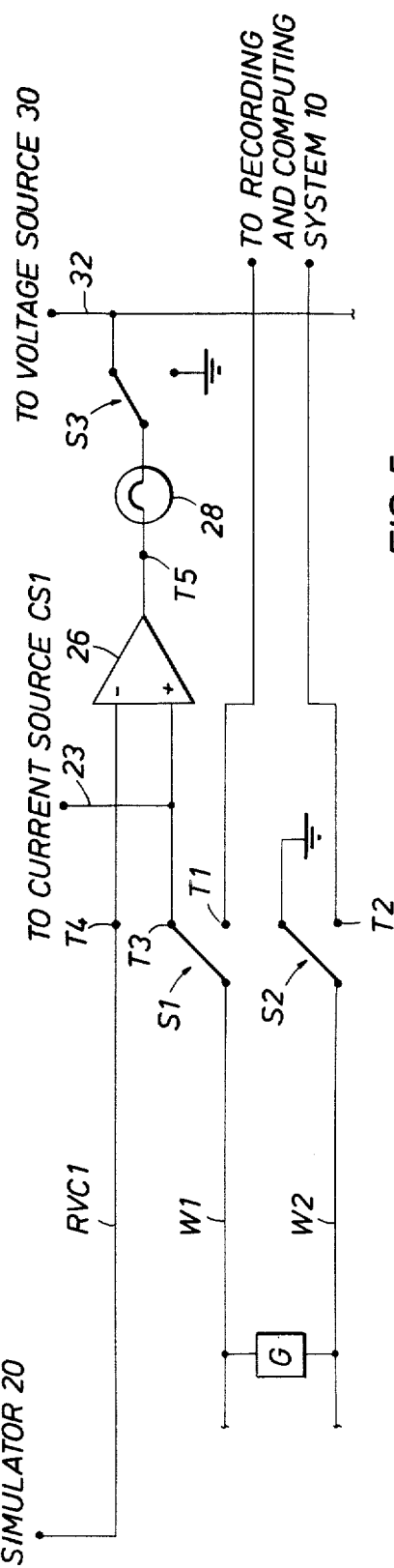
FIG. 4
FIG. 5

4,298,969

METHOD AND APPARATUS FOR TESTING THE IMPEDANCES OF GEOPHONE CHANNELS

BACKGROUND OF THE INVENTION

1. Field of the Invention

This invention relates to seismic data gathering devices. More particularly, it relates to testing the impedances of the geophone channels of such devices. This invention is applicable to devices for gathering seismic data on land, as well as to marine seismic data gathering devices. However, for clarity the description herein will be directed primarily to land seismic data gathering devices, with the understanding that the invention is not limited to land applications.

2. Description of the Prior Art

A land seismic data gathering device comprises a plurality of geophone channels and a multi-channel signal recording and computing system which typically is mounted on a truck, and may be referred to simply as a recording and computing system. Each geophone channel includes one or more geophones and a plurality of wires connecting the geophones to the recording and computing system. Typically each channel includes two wires, which may be referred to as the high and low wire, respectively. Each wire has two ends, which may be referred to for convenience as the near end and the far end, respectively. With the recording and computing system as a reference point, the near end of each wire is connected to the recording and computing system and the geophones are connected to the wires at their far ends or at points between the two ends. The geophones detect vibrations in the earth and generate electric signals representative of such vibrations. The signals are transmitted by the wires to the recording and computing system for recordation and processing.

Current practice in the field calls for using up to several hundred geophone channels; each channel is connected to from one to several hundred geophones. The geophones are manually disposed on the earth by technicians who move the geophone wires and plant each geophone in the earth at a desired location.

The accuracy and ease of interpretation of the seismic data gathered by the recording and computing system depends to a great extent on whether the impedance of each geophone channel remains reasonably constant over time. Under normal conditions, the impedance of each geophone channel varies primarily with the length of its wires and with the condition of the geophones and their connections to the wires. Ordinarily, the lengths of the wires will remain constant. However, the handling of the geophone wires and of the individual geophones may damage the insulation and the wires, as well as the parts within the geophones, and thus change the impedance of the channel. Accordingly, it is desirable frequently to test the impedance of each geophone channel for the purpose of locating defective wires and geophones. A defective channel produces no signal or a distorted signal and, when such signal is mixed with the signals of the non-defective channels, the overall signals become distorted. Such distortions can seriously impair the usefulness of the gathered seismic data.

Each geophone channel has a known nominal impedance which is a function primarily of the number of its geophones and of its length. Further, each channel has a predetermined maximum acceptable impedance and minimum acceptable impedance. These maximum and minimum acceptable impedances define a tolerance range of acceptable variation from the nominal impedance. It is desirable to determine whether the actual impedance falls within such tolerance range. If the actual impedance falls outside of the tolerance range, then the seismic crew is alerted to the possibility of a faulty geophone, such as one with a defective coil, a short between a coil and the geophone's metallic housing, or an open or shorted wire, or the like. Such faults should be located and corrected before the primary task of gathering seismic data is continued.

A commonly practiced method for making such impedance tests involves using complex switching means together with a resistance meter or ohmmeter. The geophone channels are tested seriatim by impressing a test signal on each channel individually and measuring the resistance across each channel with the resistance meter. The switching means are used to connect and disconnect each geophone channel to and from the recording and computing system and to and from the resistance meter according to the channel to be tested. See, for example, U.S. Pat. No. 2,917,706 (1959) to Thompson and FIG. 1 and the accompanying description below.

Other proposed geophone channel impedance testing systems employ a response test wherein switching means are used first for disconnecting the geophone channels from the recording and computing system and then for connecting the channels to a signal generator which simultaneously transmits a test signal to all the channels. Thereafter the geophone channels are reconnected to the recording and computing system which simultaneously records the response signals of all the geophone channels. See, for example, U.S. Pat. No. 3,858,169 (1974) to Bardeen. See also U.S. Pat. No. 3,717,810 (1973) to Spanbauer, which proposes driving the geophone channels with a constant RMS voltage or current and deriving the impedance from a measurement of the RMS voltage of the other of the voltage or current. Another proposed system involves impressing AC and DC currents of predetermined amplitudes on said geophone channels and detecting the excess of peak voltage produced by the AC current over the DC voltage generated by the DC current. See U.S. Pat. No. 4,052,694 (1974) to Fredriksson.

There is a need for a simple method and apparatus for determining without the use of the recording and computing system whether the impedances of the geophone channels fall within acceptable limits. Preferably such method and apparatus will permit the simultaneous testing of the geophone channels.

SUMMARY OF THE INVENTION

Briefly, applicant solves this problem by impressing a test current on each channel, said test current developing a test voltage across each channel, generating high and low reference voltages corresponding to the maximum and minimum acceptable impedances of each channel, and by then comparing the test voltage for each channel with the reference voltages for that channel. If the test voltage is equal to or between the reference voltages, then the impedance of the channel is acceptable; if not, then the channel needs adjustment before the next shot. In the preferred embodiment, circuitry is provided which automatically compares the voltages for each channel and displays the results of the comparisons visually, for example by lighting a lamp for a given channel if the impedance of that channel falls outside of the acceptable range. Thus, the impedance of each channel may be checked simply and quickly, without the use of the recording and computing system and without requiring the operator to interpret the measured impedance of each channel to determine whether that impedance is acceptable.

BRIEF DESCRIPTION OF THE DRAWINGS

FIG. 4 is a schematic representation of a geophone channel of the seismic data gathering system of FIG. 2 in a configuration for determining whether the impedance of that geophone channel exceeds the maximum acceptable level;

FIG. 5 is a schematic representation of a geophone channel of the seismic data gathering system of FIG. 2 in a configuration for determining whether the impedance of that channel falls below the minimum acceptable level;

DETAILED DESCRIPTION OF THE PREFERRED EMBODIMENT

Figure 1:
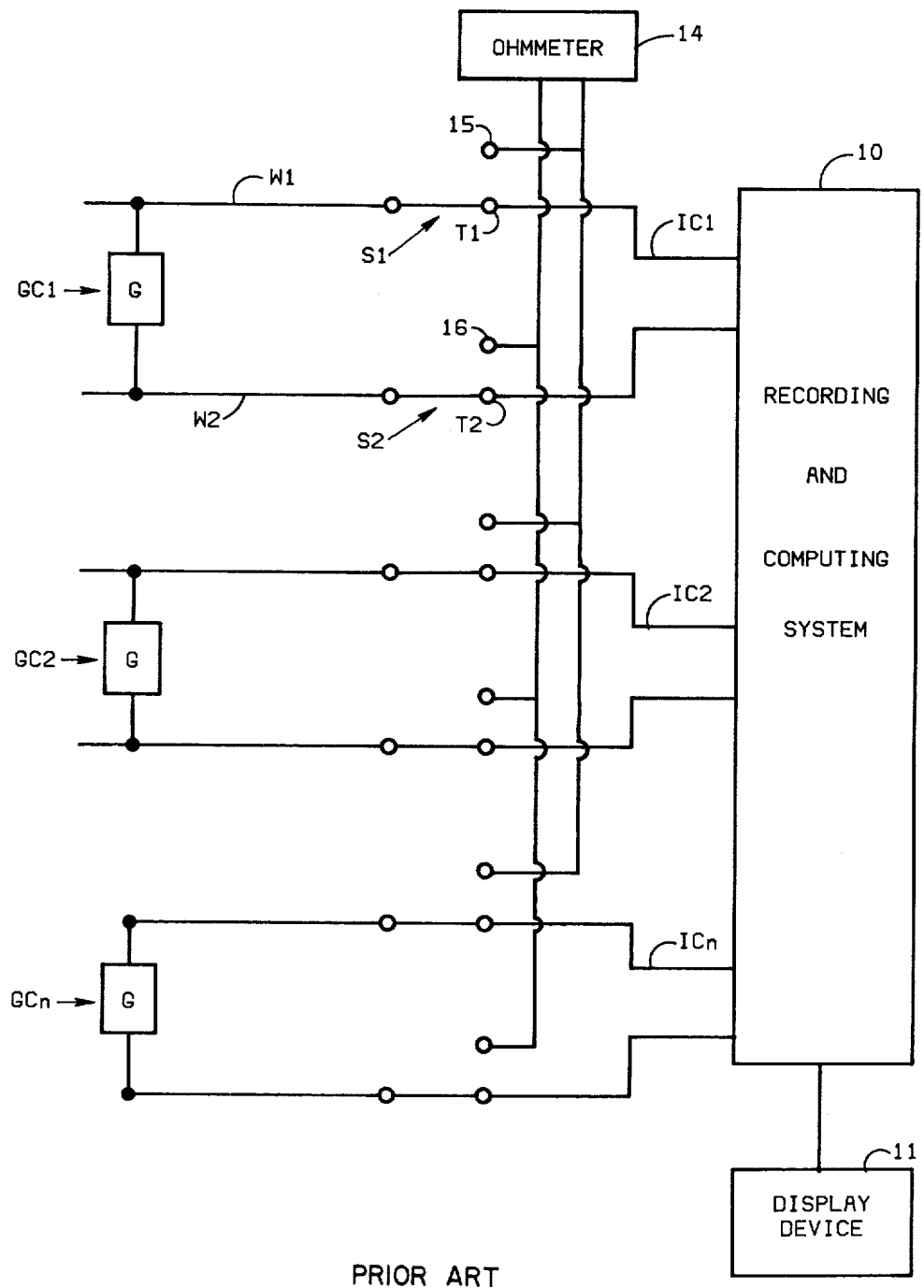
FIG. 1 is a schematic representation in block diagram form of a typical prior art seismic data gathering apparatus.

The invention will be better understood when viewed with reference to a typical prior art seismic data gathering apparatus illustrated in FIG. 1. This apparatus comprises a plurality of geophone channels GC1, GC2 ... GCn. As is well known in the art, each geophone channel includes a pair of wires W1 and W2 and a plurality of geophones G suitably connected to wires W1 and W2. For clarity, wired W1 will be considered to be the high wires and wired W2 will be considered to be the low wires. The geophones when properly coupled to the earth detect earth vibrations and produce corresponding electric signals representative of the detected vibrations.

Each geophone channel produces a signal which is recorded, stored and processed by a multi-channel signal recording and computing system 10, which has a plurality of input channels IC1, IC2 ... ICn, each with a pair of input terminals T1 and T2 for each geophone channel. System 10 may be referred to simply as a recording and computing system and may be any special or general purpose computer suitable for seismic applications. System 10 normally of course is a digital computer. Typically such computers include components for amplifying the signals received from the geophone channels, converting them to digital form, and recording, storing and processing them in accordance with a suitable software program. The processed signals can be reconverted back into analog form for display on a suitable system display terminal or other plotter or display device 11. As is shown in FIG. 1, switching devices S1 and S2 are provided for selectively connecting wires W1 and W2 to input terminals T1 and T2 and to an ohmmeter 14 which is provided for measuring the impedances of the geophone channels, as will be described.

Current practice in the field calls for using up to several hundred geophone channels, with each channel comprising from one to several hundred geophones. The geophones are manually disposed on the earth by technicians who move the geophone wires and plant each geophone in the earth at a desired location. Such handling of the geophone wires and of the individual geophones may damage the insulation and the wires, as well as the parts within the geophones. Accordingly, it is desirable frequently to test the impedance of each geophone channel for the purpose of locating defective wires and geophones. A defective channel produces no signal or a distorted signal and, when such signal is added in later processing to the signals of the non-defective channels, the overall signals become distorted. Such distortions can seriously impair the accuracy of the gathered seismic data.

Each geophone channel has a known nominal impedance which is a function primarily of its number of geophones G and of the length of its wires W1 and W2. Further, each channel has a predetermined tolerance range of acceptable variation from the nominal impedance. It is desirable to determine either the channel's absolute impedance or the variation of the geophone channel impedance from its nominal value. If the measured impedance falls outside the tolerance range, then the seismic crew is alerted to the possibility of a faulty geophone, such as one with a defective coil, a short between a coil and the geophone's metallic housing, an open or shorted geophone wire, or the like. Such faults should be located and corrected before the primary task of gathering seismic data is continued.

Ohmmeter 14 with input terminals 15 and 16 is provided for the purpose of measuring the impedances of geophone channels GC1, GC2 ... GCn seriatim. Switching devices S1 and S2 are used to connect wires W1 and W2 to the ohmmeter input terminals 15 and 16, as is illustrated for channel GC1 in FIG. 1. Switching devices S1 and S2 typically might be double-pole, double-throw switches or equivalent devices. This prior art technique is workable, but making such consecutive impedance tests on all the geophone channels requires a considerable amount of time, during which the recording and computing system 10 is down, as is heretofore mentioned. Also, the readings must be interpreted for each geophone channel, because the nominal impedance of each channel is a function of the length of its wires and other factors. Further, such switching devices are relatively expensive and frequently break down under the adverse environmental conditions typically encountered during geophysical prospecting.

Figure 2:
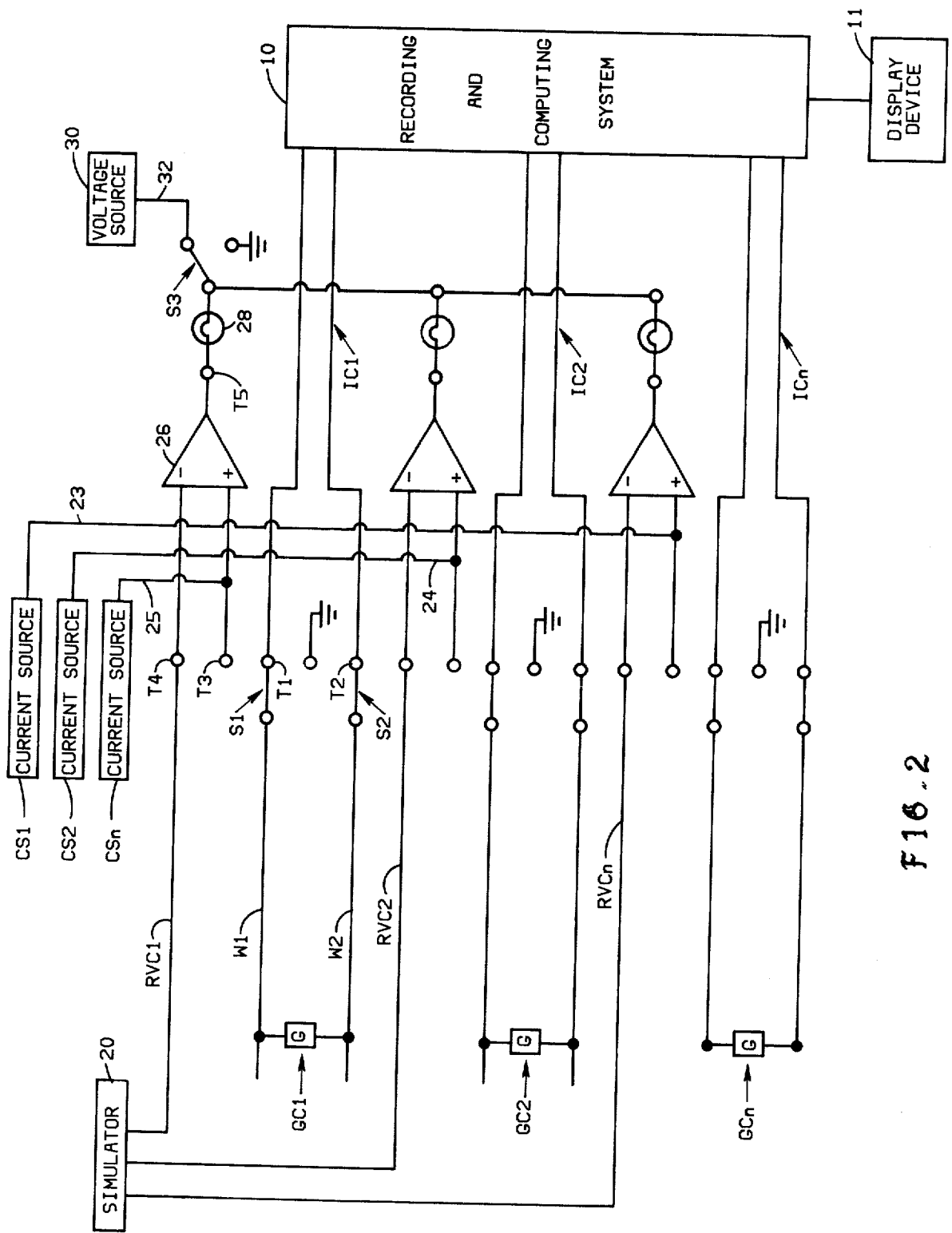
FIG. 2 is a schematic representation of a seismic data gathering system embodying the present invention and in a configuration for collecting, recording, storing and processing seismic data.
Figure 3:
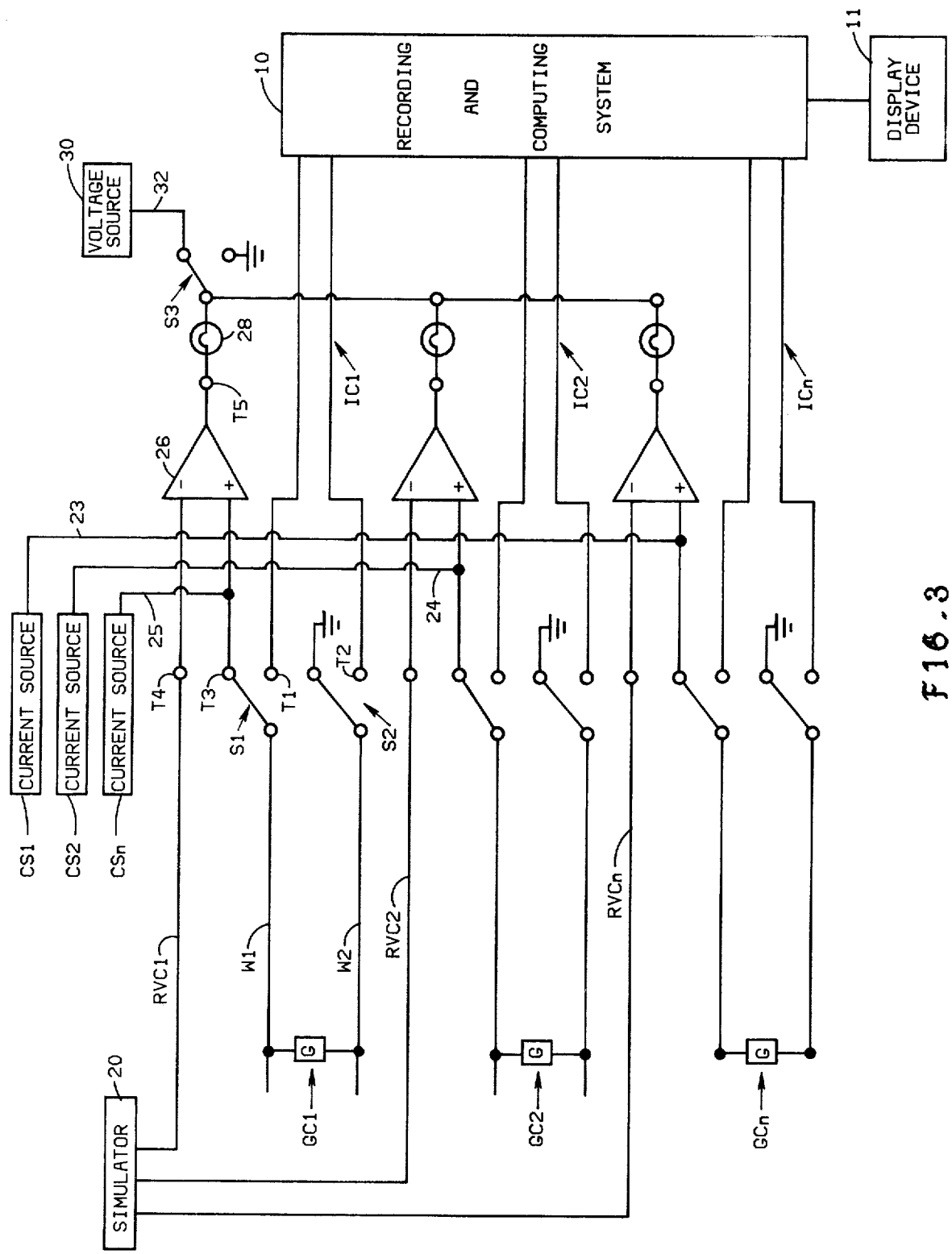
FIG. 3 is a schematic representation of the seismic data gathering system of FIG. 2 in a configuration for testing its geophone channels.

FIG. 2 and 3 illustrate the overall design of the preferred embodiment of this invention. FIG. 2 shows a seismic data gathering device embodying the invention and in a configuration for collecting, recording, storing and processing seismic data; FIG. 3 shows such device in a configuration for testing the impedances of the geophone channels between data collection. As in FIG. 1, the device includes a plurality of geophone channels GC1, GC2 ... GCn for detecting earth vibrations and producing corresponding electric signals, a recording and computing system 10 for recording, storing and processing the electric signals, and a display device 11, which may be an oscilloscope screen or other plotter, for displaying the output of the system 10. System 10 may be any special or general purpose computer suitable for seismic applications and preferably is a digital computer. Such computers are well known in the art and may be obtained from Texas Instruments in Dallas, Texas, from Geospace Corporation in Houston, Texas, and from others. Typically such computers include components for amplifying the signals received from the geophone channels, converting them to digital form, recording, storing and processing them in accordance with a suitable software program, and reconverting the processed signals to analog form for display on display device 11.

Each geophone channel has a pair of wires: a high wire W1 and a low wire W2. Each wire has two ends, a near end and a far end. Each geophone channel has one or more geophones G connected to the far ends of each pair of wires or to the wires at points between their two ends. The recording and computing system 10 has a plurality of input channels IC1, IC2 . . . ICn and each input channel has a pair of input terminals T1 and T2. The near ends of the wires W1 and W2 are connected to switching devices S1 and S2, respectively, which permit the high and low wires to be connected selectively to the input terminals T1 and T2, respectively, of the recording and computing system 10. In this configuration, the geophone channel wire pairs are connected to distinct input channels in the sense that each wire pair is connected to one and only one input channel and each input channel is connected to only one wire pair. Switching devices S1 and S2 may be double-pole, double-throw reed relays or equivalent devices.

Figure 6:
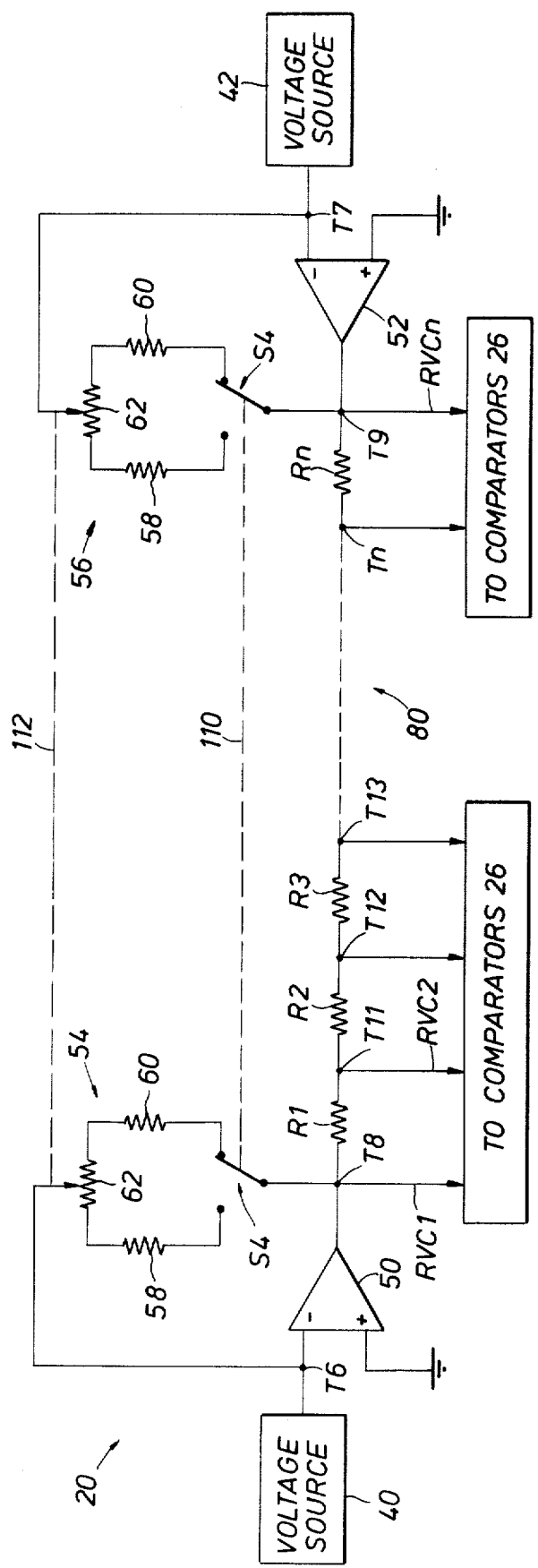
FIG. 6 is a schematic representation showing the details of the simulator of FIGS. 2 and 3.
Figure 7:
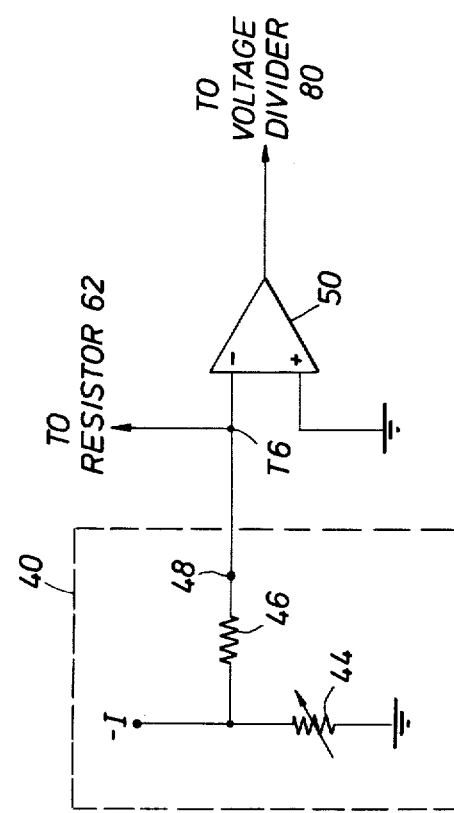
FIG. 7 is a schematic representation showing the details of the voltage sources of FIG. 6.

A simulator 20 is provided to generate a series of reference voltages corresponding to the maximum and minimum acceptable impedances of the geophone channels. The details of the simulator 20 are shown in FIGS. 6 and 7 and its operation is discussed more fully in the description which accompanies FIGS. 6 and 7.

When the device is in the configurations shown in FIGS. 3, 4 or 5, a plurality of test currents are impressed substantially simultaneously on the geophone channels for the purpose of developing for each channel a test voltage which is indicative of the impedance of each channel. A plurality of current sources CS1, CS2 . . . CSn are provided to supply test currents which are conducted to the geophone channels via conductors 23, 24, 25, respectively, as shown in FIGS. 2, 3, 4 and 5.

The test voltages of the geophone channels are compared with the reference voltages generated by the simulator to determine whether the impedances of the channels are within acceptable limits. To perform these comparisons, a comparator 26 is provided for each geophone channel. See FIGS. 2, 3, 4 and 5. Comparators 26 have positive input terminals T3, negative input terminals T4 and output terminals T5. Terminals T3 can be connected by switches S1 to geophone wires W1 to perform the impedance check which is the object of this invention. This connection is illustrated in FIGS. 3, 4 and 5. Terminals T4 are connected to simulator 20 by suitable reference voltage conductors RVC1, RVC2 . . . RVCn, which transmit to the terminals T4 separately a high reference voltage corresponding to the maximum acceptable impedance of the geophone channel in question and a low reference voltage corresponding to the minimum acceptable impedance of geophone channel in question. Each comparator 26 compares the test voltage of the channel with these reference voltages, as will be described.

The output terminal T5 of each comparator 26 is connected to a visual indicator which displays the results of the comparisons between the test voltages and the reference voltages. Clearly many types of visual indicators, such as an ammeter or voltmeter, could be used, but in the referred embodiment, illustrated in FIGS. 2, 3, 4 and 5, the visual indicator is a lamp 28.

Lamp 28 is connected to output terminal T5 and to a switching device S3, which preferably is a double-pole, double-throw relay and which selectively connects lamps 28 to ground or to a voltage source 30 via bus 32. The setting of switching device S3 is controlled according to whether the simulator 20 is generating the high or low reference voltage for that channel, so that lamp 28 will light up if the test voltage exceeds the high reference voltage or falls below the low reference voltage, that is, if the impedance of the channel is outside of acceptable limits. If the simulator 20 is generating high reference voltages, then switching device S3 is set so that each lamp 28 is connected to ground, so that if the test voltage at terminal T3 exceeds the high reference voltage at T4, a positive voltage will appear at T5 and will flow to ground through lamp 28, lighting lamp 28. See FIG. 4. If the simulator 20 is generating low reference voltages, then switching device S3 is set to connect each lamp 28 to voltage source 30 via bus 32. See FIG. 5 and FIG. 3. Voltage source 30 generates a positive voltage substantially equal to the output of comparator 26 in its positive state. Thus, when the low reference voltage at terminal T4 exceeds the test voltage at terminal T3 (indicating an unacceptably low impedance for the geophone channel), there will be substantially zero voltage at terminal T5 and current will flow from voltage source 30 through bus 32, switching device S3 and lamp 28, lighting lamp 28.

FIG. 6 illustrates the details of simulator 20. Basically, the simulator 20 comprises a first voltage source 40 providing a first voltage which is proportional to the highest nominal impedance of the geophone channels, a second voltage source 42 providing a second voltage which is proportional to the lowest nominal impedance of the geophone channels, two operational amplifiers 50 and 52 with appropriate first and second gain settings for increasing and decreasing said first and second voltages by percentages corresponding to the acceptable deviations of the impedances of the geophone channels from their nominal impedances, and a voltage divider 80 connected to the output channels of the operation amplifiers. The voltage divider generates a series of high reference voltages proportional to the maximum acceptable impedances of the geophone channels when the amplifiers are on their first gain settings and generates a series of low reference voltages proportional to the minimum acceptable impedances of the geophone channels when the amplifiers are on their second gain settings.

FIG. 7 illustrates the details of one acceptable voltage source 40. A constant current -I is fed between variable resistor 44 and a constant resistor 46, which are connected in series, variable resistor 44 also being connected to ground. By controlling the values of resistor 44 and 46 one may generate the desired voltage at point 48. Clearly a similar technique may be used for voltage source 42.

Voltage sources 40 and 42 are connected to the negative terminals of operational amplifiers 50 and 52 respectively. As will be described, these amplifiers each have two gain settings which correspond to the maximum and minimum acceptable percentage deviations of the geophone impedances from their nominal impedances. For example, if a 5 percent deviation (plus or minus) is the maximum acceptable deviation, then the gains of amplifiers 50 and 52 will be 1.05 when they are on their first settings and 0.95 when they are on their second settings.

As is well known to those skilled in the art, the gains of amplifiers 50 and 52 are controlled by the feedback impedances of those amplifiers. These impedances are indicated generally as 54 and 56, respectively, and comprise resistors 58, 60 and 62. See FIG. 6. Resistors 58 and 60 are connected in parallel and are connected at one end through variable resistors 62 to the negative input terminals T6 and T7, respectively, of amplifiers 50 and 52. Resistors 58 and 60 are connected at the other end through switches S4 to the output terminals T8 and T9, respectively, of the amplifiers 50 and 52. Switches S4 preferably are double-pole, double-throw reed relays or equivalent devices. The gains of the amplifiers are a function of the values of the resistors 58, 60 and 62 and of the settings of swithes S4. By means well known to those skilled in the art, the gains can be made equal to $(1 \pm X)$, where X varies from 0 to 1 according to the value of resistors 62 and where the sign of X is controlled by the settings of switches S4. In fact, the gains could be made equal to $1+X$ and $1-Y$, where X and Y are different, but in normal application (and thus the preferred embodiment) X is equal to Y.

A voltage divider indicated generally at 80 and comprising a plurality of resistors R1, R2, R3 ... Rn connected in series is connected to the output erminals T8 and T9, respectively, of amplifiers 50 and 52. This voltage divider generates a series of voltages at points T11, T12, T13 ... Tn ranging in value between the maximum voltage at output terminal T8 and the minimum voltage at output terminal T9. By means well known to those skilled in the art, the number and values of resistors R1 ... Rn are selected so that the voltages produced correspond to the differences in the nominal impedances of the geophone channels. Thus, when switches S4 are on their first settings, amplifiers 50 and 52 have gains of $1+X$ (where X has been previously selected). In that event, a voltage proportional to the nominal impedance of the geophone channel with the highest impedance is generated at point T6, and a high reference voltage proportional to the maximum acceptable impedance for the geophone channel is generated at point T8. A voltage proportional to the nominal impedance of the geophone channel with the lowest impedance is generated at point T7, and a high reference voltage proportional to the maximum acceptable impedance for that geophone channel is generated at point T9. A series of high reference voltages proportional to the maximum acceptable impedances for the other geophone channels is generated at points T11 ... Tn. These reference voltages are transmitted to the appropriate comparators 26 by reference voltage conductors RVC1, RVC2 ... RVCn.

When switches S4 are on their second settings, a voltage proportional to the nominal impedance of the geophone channel with the highest impedance is still generated at point T6, but a low reference voltage proportional to the minimum acceptable impedance for that geophone channel is generated at point T8. A voltage proportional to the nominal impedance of the geophone channel with the lowest impedance is still generated at point T7, but a low reference voltage proportional to the minimum acceptable impedance for that geophone is generated at point T9. A series of low reference voltages proportional to the minimum acceptable impedances for the other geophone channels is generated at points T11 ... Tn. These reference voltages are transmitted to the appropriate comparators 26 by conductors RVC1, RVC2 ... RVCn.

Switches S4 are ganged with each other, as is indicated by the dotted line 110, and with switches S3 (see FIGS. 2, 3, 4 and 5) to ensure the proper generation of the reference voltages and the proper functioning of the lamps 28 as indicators of possibly defective geophone channels. As is indicated by dotted line 112 in FIG. 6, ordinarily the values of variable resistors 62 will be changed together, although this is not necessary to the practice of the invention.

In operation, nominal impedances for the geophone channels with the highest and lowest nominal impedances are determined. Voltage sources 40 and 42 are set to generate voltages proportional to these nominal voltages. Variable resistors 62 are set in accordance with the acceptable maximum and minimum deviations of the geophone channel impedances from their nominal values. Switches S4 are set to control the gains of the operational amplifiers 50 and 52 so that simulator 20 develops a series of high reference voltages which are proportional to the maximum acceptable impedances of the geophone channels (e.g., 105% of nominal impedances). These voltages are transmitted to their respective comparators 26 for comparison with the voltages developed across the geophone channels as switches S1 and S2 are positioned to connect the geophone wires W1 and W2 to the comparators 26 and to ground respectively and as currents are impressed on the geophone channels from current sources CS1, CS2 ... CSn. The magnitudes of the currents from the current surces CS1, CS2 ... CSn and the voltages from voltage sources 40 and 42 are coordinated by means well known to those skilled in the art, so that the comparisons will be meaningful. Switche S3 is set to the position shown in FIG. 4, so that a light will indicate defective geophone channel. Switches S4 then are changed to positions to control the gains of the amplifiers 50 and 52 so that simulator 20 develops a series of low reference voltages which are proportional to the minimum acceptable impedances of the geophone channels (e.g., 95% of nominal impedances). These voltages are transmitted to their respective comparators 26 for comparison with the voltages developed across the geophone channels as switches S1 and S2 remain positioned to connect the geophone wires W1 and W2 to the comparators 26 and to ground respectively and as the currents from current sources CS1, CS2 ... CSn are impressed on the geophone channels (preferably substantially simultaneously). The magnitudes of these currents and the voltages from voltage sources 40 and 42 remain coordinated so that the comparisons will be meaningful. Switch S3 is set to the position shown in FIG. 5, so that a light will indicate a defective geophone channel.

While the operation has been described on a step-by-step basis for clarity, it may be appreciated that all or part of the above procedure could be automated, for example by controlling switches S1, S2, S3 and S4 automatically by a master clock in appropriate situations. Further, the steps could be performed in a different order than has been described.

From the above, it may be appreicated that the invention permits a reliable, easy and relatively simple and inexpensive testing of the geophone channels. As many of the channels as may be desirable can be tested simultaneously.

The foregoing disclosure and description of the invention are illustrative and explanatory thereof, and various changes in the components, as well as in the details of the illustrated circuitry and the steps of operation, may be made within the scope of the appended claims without departing from the spirit of the invention.

I claim:

1. An apparatus for testing the impedances of a plurality of geophone channels of a seismic data gathering device, said apparatus comprising:
   a plurality of current sources which feed test currents into the geophone channels to develop a test voltage across each channel that is proportional to that channel's impedance;
   a comparator for each geophone channel, said comparator being connected to each channel to compare the test voltage for that channel with a high reference voltage that is proportional to the maximum acceptable impedance for that channel and with a low reference voltage that is proportional to the minimum acceptable impedance for that channel; and
   a simulator for developing the high and low reference voltages for each channel, said simulator being connected to each channel and comprising
      a first voltage source providing a first voltage which is proportional to the lowest nominal impedance of the geophone channels;
      a second voltage source providing a second voltage which is proportional to the highest nominal impedance of the geophone channels;
      a first operational amplifier having a first gain setting and a second gain setting and receiving said first voltage at one of its input terminals;
      a second operational amplifier having a first gain setting and a second gain setting and receiving said second voltage at one of its input terminals, said first and second gain settings being substantially equal to those of the first operational amplifier;
      a voltage divider coupled to the output terminals of the operational amplifiers, said voltage divider providing a series of high reference voltages proportional to the maximum acceptable impedances of the geophone channels when said amplifiers are on their first gain settings and said voltage divider providing a series of low reference voltages proportional to the minimum acceptable impedances of the geophone channels when said amplifiers are on their second settings; and
      means connected to said amplifier for controlling the gain settings of the amplifiers,
   whereby a measurement is made for each channel whether the impedance of that channel falls within acceptable limits.

2. The apparatus of claim 1, wherein the current sources feed the test currents to the channels substantially simultaneously.

3. The apparatus of claim 1, including also for at least one channel a visual indicator which visually displays the results of the comparisons between the high and low reference voltages and the test voltage, said visual indicator being connected to the comparator.

4. A seismic data gathering device, said device including:
   a signal recording and computing system, said system having a plurality of input channels;
   a plurality of geophone channels, each channel having one or more geophones and a pair of wires, each wire pair being connected to the geophones of that channel;
   means for selectively connecting the wire pairs of the geophone channels to distinct input channels of the recording and computing system;
   a plurality of current sources of test currents to be fed into the geophone channels to develop a test voltage across each channel that is proportional to the channel's impedance;
   means for selectively connecting said current sources to the geophone channels;
   a comparator for each channel for comparing the test voltage developed across that channel with a high reference voltage that is proportional to the maximum acceptable impedance for that channel and with a low reference voltage that is proportional to the minimum acceptable impedance for that channel;
   means for connecting the comparators to the channels; and
   a simulator for developing for each channel the high and low reference voltages, said simulator being connected to each channel and comprising
      a first voltage source providing a first voltage which is proportional to the lowest nominal impedance of the geophone channels;
      a second voltage source providing a second voltage which is proportional to the highest nominal impedance of the geophone channels;
      a first operational amplifier having a first gain setting and a second gain setting and receiving said first voltage at one of its input terminals;
      a second operational amplifier having a first gain setting and a second gain setting and receiving said second voltage at one of its input terminals, said first and second gain settings being substantially equal to those of the first operational amplifier;
      a voltage divider coupled to the output terminals of the operational amplifiers, said voltage divider providing a series of high reference voltages proportional to the maximum acceptable impedances of the geophone channels when said amplifiers are on their first gain settings and said voltage divider providing a series of low reference voltages proportional to the minimum acceptable impedances of the geophone channels when said amplifiers are on their second settings; and
      means connected to said amplifiers for controlling the gain settings of the amplifiers.

5. The device of claim 4, said device further comprising a plurality of visual indicators, at least one for every channel and connected to the comparator for its channel, said indicators displaying the results of the comparisons between the high and low reference voltages and the test voltage developed across that channel,
   whereby, when the current sources are connected to the channels and when the simulator and wires are connected to the comparators, a visual indication is generated for each channel showing whether the impedance of that channel is within acceptable limits.

6. The device of claim 4, wherein said comparators each have two input terminals and an output terminal, one of said input terminals being connected to the simulator and the other of said input terminals being connected to one of the wires of the geophone channel, and the output terminal being connected to the vidual indicator.

* * * * *